(12) United States Patent
Kwon et al.

(10) Patent No.: US 8,016,632 B2
(45) Date of Patent: Sep. 13, 2011

(54) LIGHT EMITTING DISPLAY DEVICE AND METHOD OF FABRICATING THE SAME

(75) Inventors: Oh-june Kwon, Suwon-si (KR);
 Seung-yong Song, Suwon-si (KR);
 Young-seo Choi, Suwon-si (KR);
 Sun-young Jung, Suwon-si (KR);
 Young-cheol Joo, Suwon-si (KR);
 Ji-hun Ryu, Suwon-si (KR); Kwan-hee Lee, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 257 days.

(21) Appl. No.: 12/135,920

(22) Filed: Jun. 9, 2008

(65) Prior Publication Data
US 2009/0039760 A1 Feb. 12, 2009

(30) Foreign Application Priority Data

Aug. 8, 2007 (KR) .................. 10-2007-0079528

(51) Int. Cl.
 *H01L 51/56* (2006.01)
 *H01J 9/32* (2006.01)
 *H01J 9/26* (2006.01)
(52) U.S. Cl. .................. 445/25; 445/24; 313/512
(58) Field of Classification Search .......... 313/498–512; 445/24–26
See application file for complete search history.

(56) References Cited

U.S. PATENT DOCUMENTS

| 6,590,337 | B1 | 7/2003 | Nishikawa et al. | |
|---|---|---|---|---|
| 7,431,628 | B2* | 10/2008 | Park et al. | 445/25 |
| 7,700,462 | B2* | 4/2010 | Tanaka et al. | 438/487 |
| 2003/0164674 | A1* | 9/2003 | Imamura | 313/493 |
| 2004/0169174 | A1 | 9/2004 | Huh et al. | |
| 2004/0171184 | A1 | 9/2004 | Maruyama et al. | |

(Continued)

FOREIGN PATENT DOCUMENTS

CN 1870842 11/2006

(Continued)

OTHER PUBLICATIONS

Machine Translation Fujisawa et al JP 2001-091956 A.*

(Continued)

*Primary Examiner* — Nimeshkumar Patel
*Assistant Examiner* — Jose M Diaz
(74) *Attorney, Agent, or Firm* — Knobbe, Martens, Olson & Bear, LLP (57) ABSTRACT

Disclosed is a light emitting display device including a seal and a method of fabricating the same. The light emitting display device includes a first substrate composed of a pixel region and a non-pixel region disposed around the pixel region; a pad portion formed in the non-pixel region to supply a signal to the pixel region; a second substrate disposed to face the first substrate; and a seal provided between the first substrate and the second substrate and disposed to surround the pixel region. Here, the seal is disposed on a first side between the pixel region and the pad portion, on a second side facing the first side, and on an outer ring of third sides contacting both ends of the first side and the second side, and the seal disposed in the outer ring of the third sides is filled up to contour lines of the first substrate and the second substrate.

4 Claims, 11 Drawing Sheets

U.S. PATENT DOCUMENTS

| | | | |
|---|---|---|---|
| 2006/0135029 A1* | 6/2006 | Harada | 445/25 |
| 2006/0270304 A1* | 11/2006 | Aita | 445/25 |
| 2007/0018566 A1* | 1/2007 | Yamazaki et al. | 313/498 |
| 2007/0040798 A1* | 2/2007 | Kawai | 345/107 |
| 2007/0111424 A1* | 5/2007 | Suzawa et al. | 438/216 |
| 2007/0161159 A1* | 7/2007 | Yamazaki et al. | 438/149 |
| 2007/0205719 A1* | 9/2007 | Kim | 313/512 |
| 2010/0059748 A1* | 3/2010 | Yamazaki et al. | 257/49 |
| 2010/0091233 A1* | 4/2010 | Yamagishi | 349/153 |

FOREIGN PATENT DOCUMENTS

| | | |
|---|---|---|
| EP | 1 662 590 | 5/2006 |
| JP | S54-137358 | 10/1979 |
| JP | 2001-075064 | 3/2001 |
| JP | 2001-091956 | 4/2001 |
| JP | 2002-296574 | 10/2002 |
| JP | 2003-007457 | 1/2003 |
| JP | 2003-084293 | 3/2003 |
| JP | 2004-205729 | 7/2004 |
| JP | 2004-355009 | 12/2004 |
| JP | 2005078932 A * | 3/2005 |
| JP | 2006-150642 | 6/2006 |
| JP | 2006-156361 | 6/2006 |
| JP | 2006-244809 | 9/2006 |
| JP | 2006-286266 | 10/2006 |
| JP | 2006-286412 | 10/2006 |
| JP | 2006-330185 | 12/2006 |
| JP | 2006-351382 | 12/2006 |
| JP | 2007-271749 | 10/2007 |
| KR | 1020040002956 | 1/2004 |
| KR | 1020060077322 | 7/2006 |
| KR | 1020070012564 | 1/2007 |
| WO | WO 2006/088185 | 8/2006 |

OTHER PUBLICATIONS

Office Action dated Jan. 8, 2010 for corresponding CN Application No. 200810134958.4.

Office Action dated Oct. 19, 2010 for JP Application No. 2007-315044 which claims priority to priority Application KR 10-2007-0079528.

Partial European Search Report dated Feb. 18, 2011 for corresponding EP Application No. 08252657.5.

* cited by examiner

LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2007-0079528, filed on Aug. 8, 2007 in the Korean Intellectual Property Office, the entire contents of which is incorporated by reference herein.

BACKGROUND

1. Technical Field

The present disclosure relates to a light emitting display device and a method of fabricating the same, and more particularly to a light emitting display device including a seal, and a method of fabricating the same.

2. Discussion of Related Art

Figure 1:
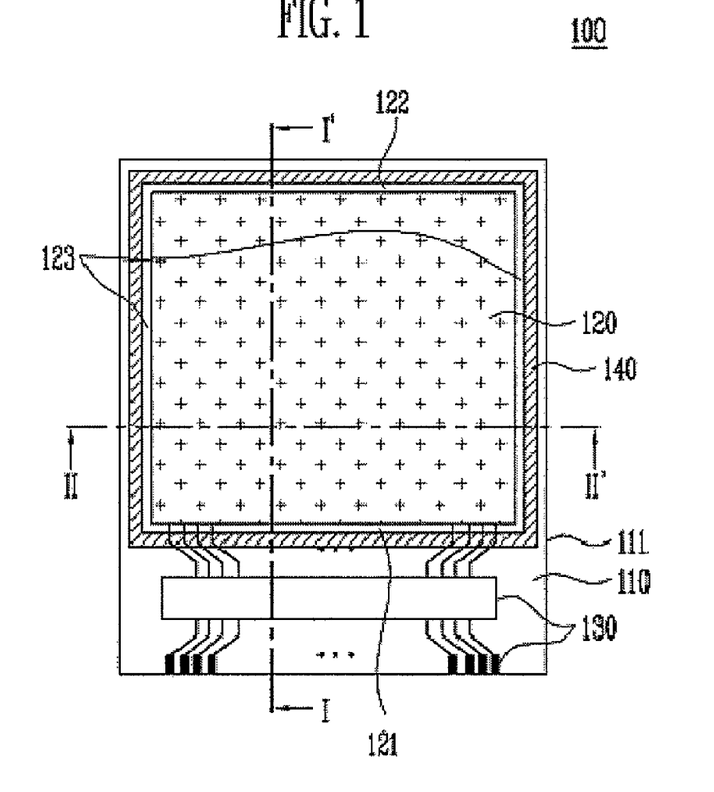
FIG. 1 is a top view showing an embodiment of an organic light emitting display device.
Figure 2A:
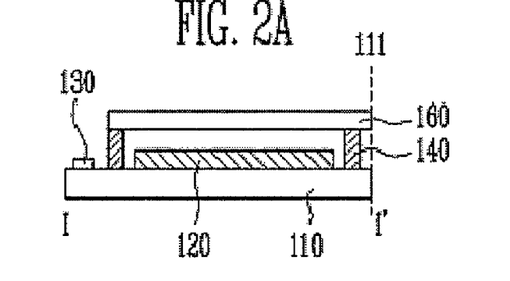
FIG. 2A is a cross-sectional view taken along section line I-I' of FIG. 1.
Figure 2B:
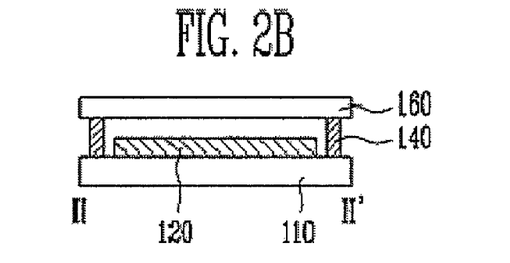
FIG. 2B is a cross-sectional view taken along section line II-II' of FIG. 1.

FIG. 1 is a top view showing an organic light emitting display device 100. FIG. 2A is a cross-sectional view taken along section line I-I' of FIG. 1. FIG. 2B is a cross-sectional view taken along section line II-II' of FIG. 1.

Referring to FIGS. 1, 2A, and 2B, the organic light emitting display device 100 includes a first substrate 110 having an organic light emitting diode 120 and a pad portion 130 formed therein; a second substrate 160 for protecting the organic light emitting diode 120; and a seal 140 for coupling the second substrate 160 to the first substrate 110.

The organic light emitting diode 120 is formed on a pixel region of the first substrate 110, and the pad portion 130 is formed on a non-pixel region of the first substrate 110, surrounding the pixel region. Also, the second substrate 160 is disposed on the first substrate 110 to protect the organic light emitting diode 120 formed on a pixel region of the first substrate 110. The first substrate 110 and the second substrate 160 are coupled to each other by the seal 140 disposed around the organic light emitting diode 120.

At this time, the seal 140 is disposed between the first substrate 110 and the second substrate 160, both of which are disposed around the organic light emitting diode 120. Also, the seal 140 is disposed in an outer ring defined by a second side 122, third sides 123, and a first side 121. Except for the first side 121, the outer ring, that is the second side 122 and third sides 123, is disposed between the first substrate 110 and the second substrate 160, and spaced at a constant distance from a contour line 111. The first side 121 is disposed between the organic light emitting diode 120 and the pad portion 130. The second side 122 is opposite of facing the first side 121, and the third sides 123 are adjacent to and contact both ends of the first side 121 and the second side 122.

Also, the seal 140 disposed between the first substrate 110 and the second substrate 160 is spaced apart at a constant distance from the contour line 111 on the second 122 and third 123 sides, and therefore a space is formed in an outside of the seal 140 between the first substrate 110 and the second substrate 160.

Figure 3A:
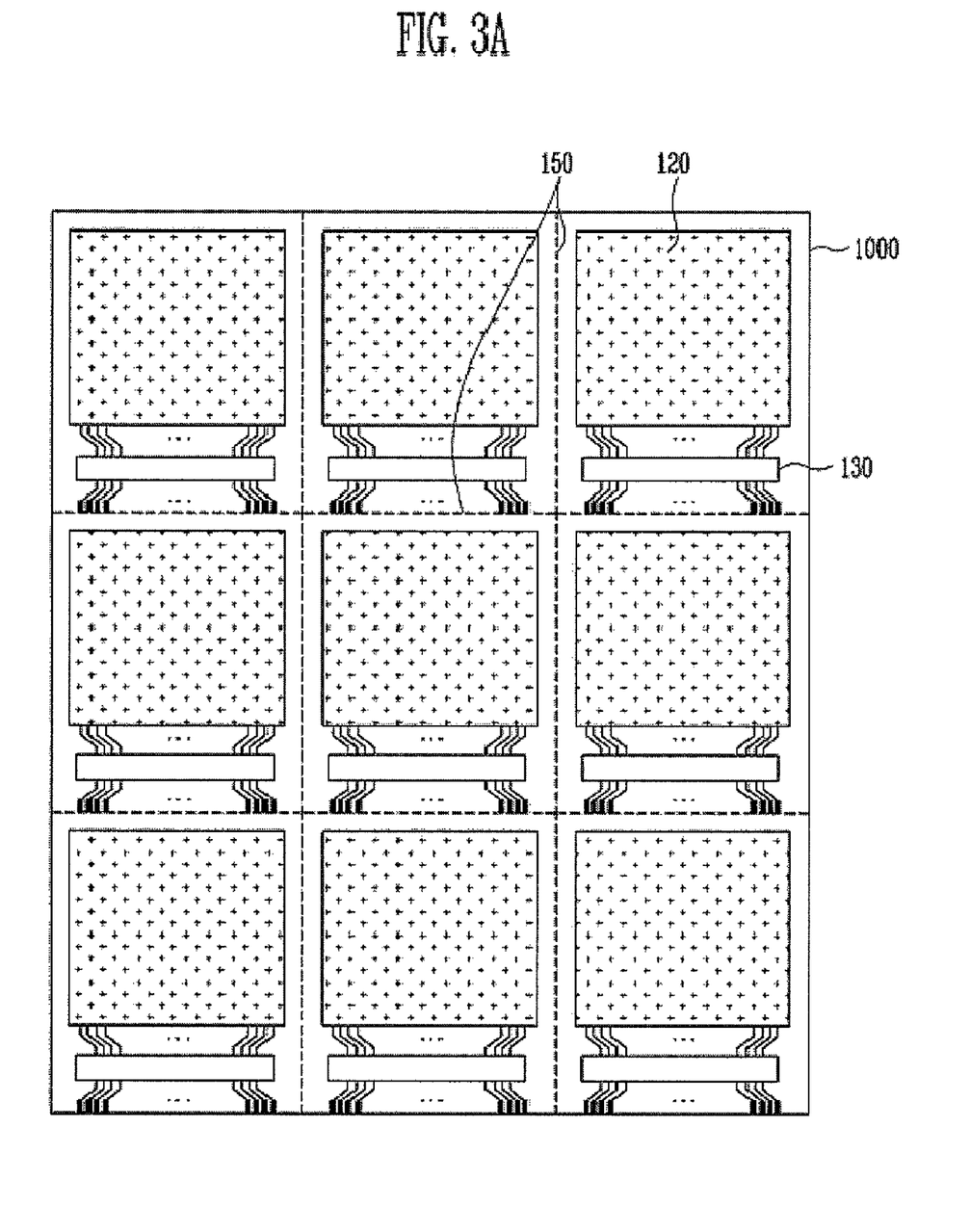
FIGS. 3A to 3C are top process views showing an embodiment of a method of fabricating an organic light emitting display device.
Figure 3B:
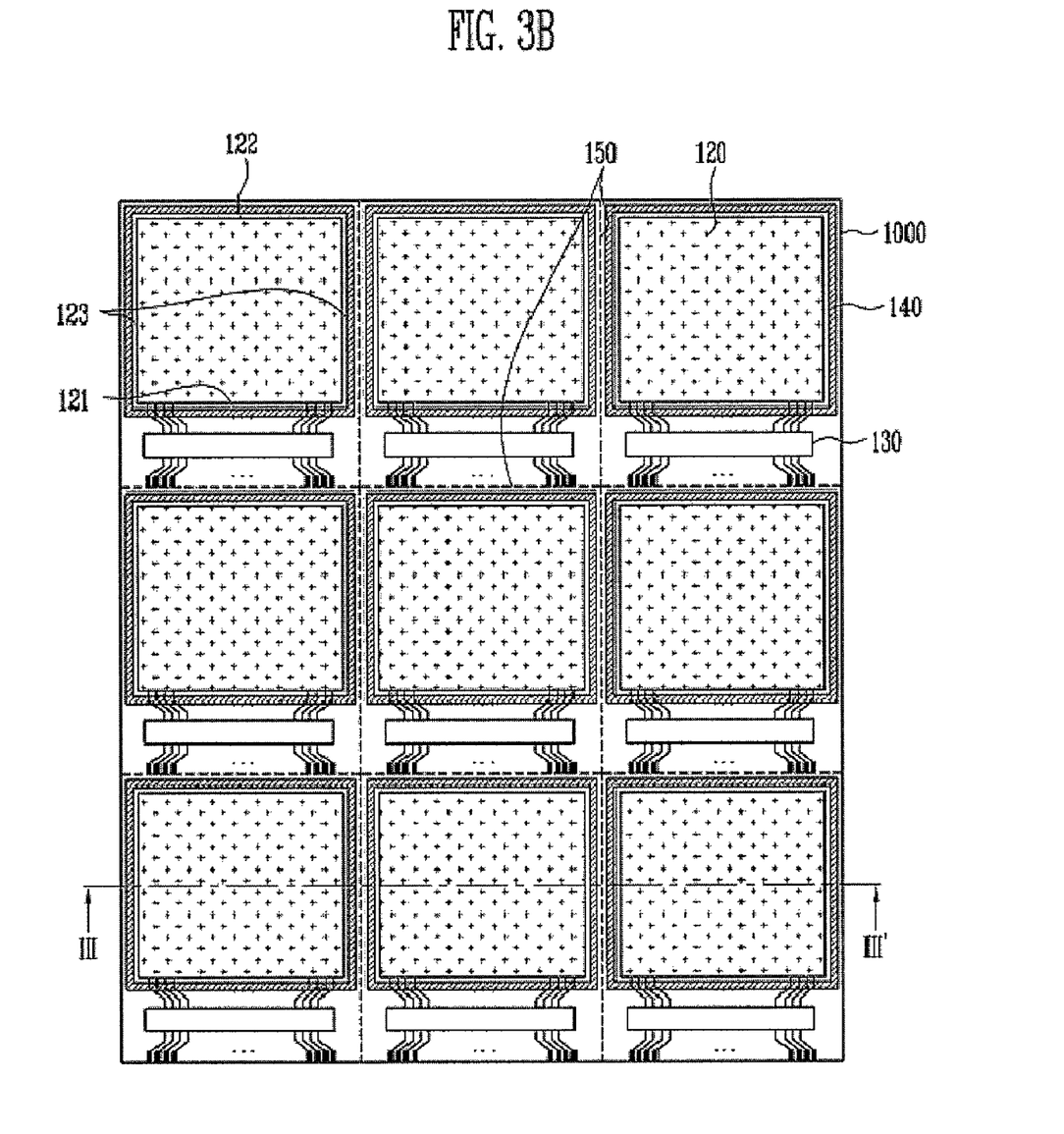
Figure 3C:
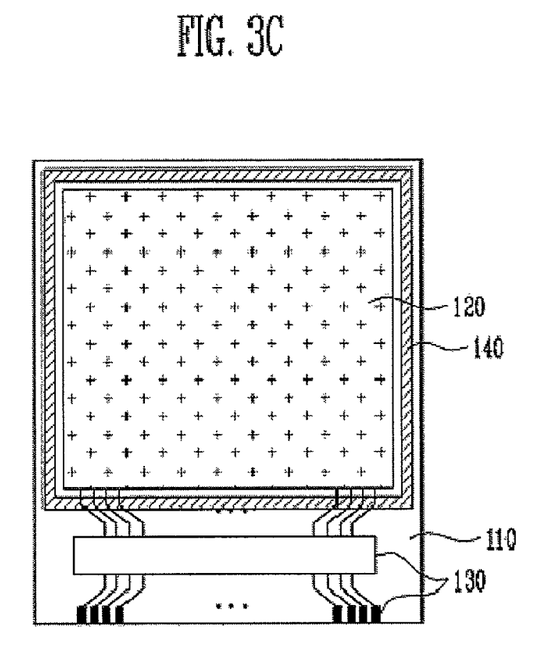
Figure 4:
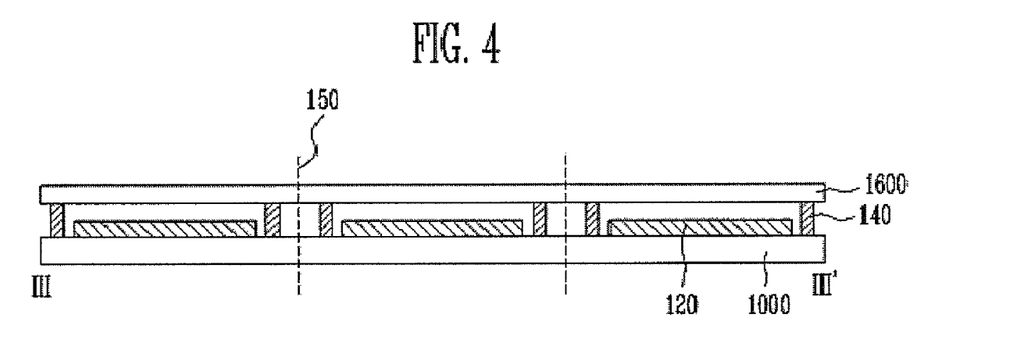
FIG. 4 is a cross-sectional view taken along section line III-III' of FIG. 3B.

FIGS. 3A to 3C are top process views showing a method of fabricating an organic light emitting display device. FIG. 4 is a cross-sectional view taken along line III-III' of FIG. 3B.

Referring to FIG. 3A, a plurality of organic light emitting diodes 120 and a pad portion 130 are formed on a first mother substrate 1000.

Referring to FIG. 3B, the seal 140 is applied onto a second mother substrate 1600 (FIG. 4) corresponding to the respective circumference of each organic light emitting diode 120, thereby coupling the second mother substrate 1600 (see FIG. 4) to the first mother substrate 1000.

Referring to FIG. 4, a scribing process is carried out on each of the first mother substrate 1000 and second mother substrate 1600 along a scribe line 150. The scribe line 150, which defines a plurality of display panel regions, comprises crossed lines between adjacent organic light emitting diodes 120.

Referring to FIG. 3C, after the scribing process is carried out, the coupled first mother substrate 1000 and second mother substrate 1600 are separated into respective unit display panels. Each of the separated display panels includes a first substrate 110, a second substrate 160, and a seal 140 disposed between the first substrate 110 and the second substrate 160.

Also, a portion of the second substrate 160 disposed on or over the pad portion 130 is cut away to expose the pad portion 130 to the external environment. A flexible printed circuit board for supplying a signal to the organic light emitting diode 120 may be coupled to the exposed pad portion 130.

However, the organic light emitting display device 100 formed as described above has problems, including that a forming time and/or a curing time of the seal 140 are extended since the seal 140 is applied around the organic light emitting diode 120, and a laser irradiation apparatus moves along a shape of the seal 140.

SUMMARY OF THE INVENTION

Accordingly, some embodiments described herein are designed to solve such drawbacks, and therefore one object is to provide a light emitting display device capable of reducing a forming time and a curing time of a seal by forming common seal lines between adjacent light emitting diodes when a plurality of the light emitting diodes are manufactured on a mother substrate.

Some embodiments provide a light emitting display device comprising a first substrate comprising a pixel region and a non-pixel region; a second substrate facing the first substrate; a pad portion disposed on the non-pixel region; and a seal disposed around the pixel region between the first substrate and the second substrate. The seal comprises a first side disposed between the pixel region and the pad portion, a second side opposite from the first side, and third sides adjacent to and contacting the ends of the first side and second side. In some embodiments, the third sides of the seal extend to the edges of the first substrate and the second substrate. In some embodiments, portions of the seal extend along sides of the pad portion. Some embodiments provide a method for manufacturing individual display devices from a mother substrate in which a portion of a seal on the mother substrate is cut or diced to provide seals of adjacent display devices. Some embodiments improve throughput by reducing the time for forming and curing the seal.

The first exemplary embodiment comprises providing a light emitting display device including a first substrate composed of a pixel region and a non-pixel region disposed around the pixel region; a pad portion formed in the non-pixel region to supply a signal to the pixel region; a second substrate disposed to face the first substrate; and a seal provided between the first substrate and the second substrate and disposed to surround the pixel region. Here, the seal is disposed at a first side between the pixel region and the pad portion, at a second side facing the first side, and at an outer ring of a third side present in both ends of the first side and the second side, and the seal disposed in the outer ring of the third side is filled up to contour lines of the first substrate and the second substrate.

The second exemplary embodiment comprises providing a light emitting display device including a first substrate composed of a pixel region and a non-pixel region disposed around the pixel region; a pad portion formed in the non-pixel region to supply a signal to the pixel region; a second substrate disposed to face the first substrate; and a seal provided between the first substrate and the second substrate and disposed to surround the pixel region. Here, the seal is disposed at a first side between the pixel region and the pad portion, at a second side facing the first side, and at an outer ring of a third side present in both ends of the first side and the second side, and an additional seal extending from the seal disposed at the outer ring of the third side is disposed at an outer ring of a side surface of the pad portion.

Another exemplary embodiment comprises a method of fabricating a light emitting display device including cutting a first mother substrate and a second mother substrate to separate the first mother substrate and the second mother substrate into unit display panels, the first mother substrate and the second mother substrate having a plurality of unit display panel regions defined by first scribe lines disposed between homogeneous regions and second scribe lines disposed between heterogeneous regions, the method including providing a first mother substrate including a pixel region having a plurality of light emitting diodes formed therein and a non-pixel region surrounding the pixel region and having a pad portion formed therein; applying a seal to include a circumference of the pixel region and the first scribe lines; disposing a second mother substrate on the first mother substrate; curing the seal to couple the second mother substrate to the first mother substrate; and cutting the coupled first mother substrate and second mother substrate along the first and second scribe lines to separate the first mother substrate and the second mother substrate into individual unit display panels.

Some embodiments provide a light emitting display device, comprising: a first substrate comprising a pixel region and a non-pixel region disposed around the pixel region; a pad portion disposed in the non-pixel region configured to supply a signal to the pixel region; a second substrate facing the first substrate; and a seal disposed between the first substrate and the second substrate, surrounding the pixel region, wherein the seal comprises a first side disposed between the pixel region and the pad portion, a second side opposite the first side, and on third sides contacting both ends of the first side and the second side, and the seal on the third sides extends to the outer edges of the first substrate and the second substrate.

In some embodiments, at least a portion of the seal disposed on the second side does not extend to the outer edges of the first substrate and the second substrate. In some embodiments, the seal comprises an inorganic sealant.

Some embodiments provide a light emitting display device, comprising: a first substrate comprising a pixel region and a non-pixel region disposed around the pixel region; a pad portion disposed on the non-pixel region configured to supply a signal to the pixel region; a second substrate facing the first substrate; and a seal disposed between the first substrate and the second substrate, surrounding the pixel region, wherein the seal comprises a first side disposed between the pixel region and the pad portion, a second side opposite the first side, and third sides contacting both ends of the first side and the second side, and portions of the third sides of the seal extend along sides of the pad portion.

In some embodiments, the first side and the second side of the seal have substantially the same width. In some embodiments, the third sides of the seal and the portions of the seal disposed along sides of the pad portion have substantially the same width.

In some embodiments, at least one the second side of the seal, the third sides of the seal, and the portions of seal disposed along the sides of the pad portion extend to the outer edges of the first substrate and the second substrate. In some embodiments, the seal comprises an inorganic sealant.

Some embodiments provide a method of fabricating a light emitting display device comprising: providing a first mother substrate comprising a plurality of unit display panels disposed thereon, first scribe lines disposed between homogeneous regions of adjacent display panels, and second scribe lines disposed between heterogeneous regions of adjacent display panels, wherein each unit display panel comprises a pixel region comprising a plurality of light emitting diodes formed therein and a non-pixel region surrounding the pixel region comprising a pad portion formed therein; applying a seal around a circumference of the pixel region and over the first scribe lines; disposing a second mother substrate on the first mother substrate, wherein the second mother substrate comprises first scribe lines and second scribe lines corresponding to the first scribe lines and second scribe lines of the first mother substrate; curing the seal to couple the second mother substrate to the first mother substrate; and cutting the coupled first mother substrate and second mother substrate along the first and second scribe lines to separate the first mother substrate and the second mother substrate into individual unit display panels.

In some embodiments, the curing the seal comprises disposing a mask on the pad portion.

Some embodiments further comprise cutting and removing a portion of the second substrate disposed on the pad portion, thereby exposing the pad portion of the unit display panel after separating the coupled first mother substrate and second mother substrate into individual unit display panels.

Some embodiments further comprise removing the seal from the non-pixel region of the pad portion.

BRIEF DESCRIPTION OF THE DRAWINGS

These and/or other embodiments and features will become apparent and more readily appreciated from the following description of certain exemplary embodiments, taken in conjunction with the accompanying drawings of which.

DETAILED DESCRIPTION OF CERTAIN EMBODIMENTS

In the following detailed description, only certain exemplary embodiments are shown and described, simply by way of illustration. As those skilled in the art would realize, the described embodiments may be modified in various different ways, all without departing from the spirit or scope thereof. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "coupled to" another element, it can be directly connected to the element or be indirectly connected to the element with one or more intervening elements interposed therebetween. Hereinafter, like reference numerals refer to like elements.

Figure 5:
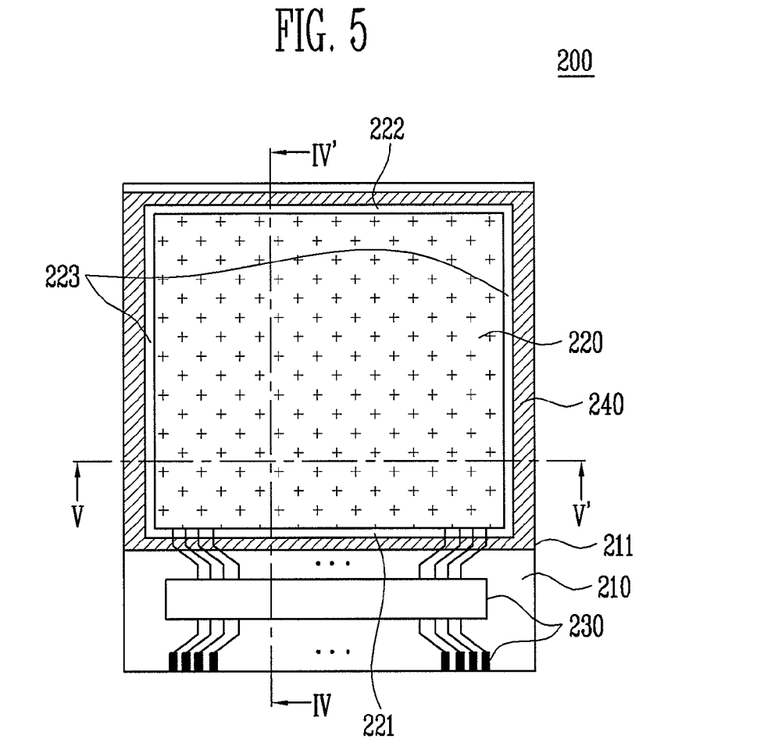
FIG. 5 is a top view showing an organic light emitting display device according to a first exemplary embodiment.
Figure 6A:
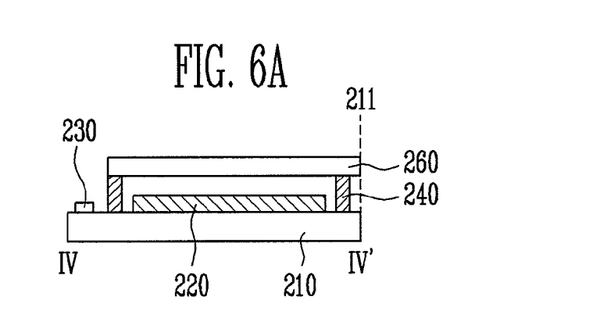
FIG. 6A is a cross-sectional view taken along section line IV-IV' of FIG. 5.
Figure 6B:
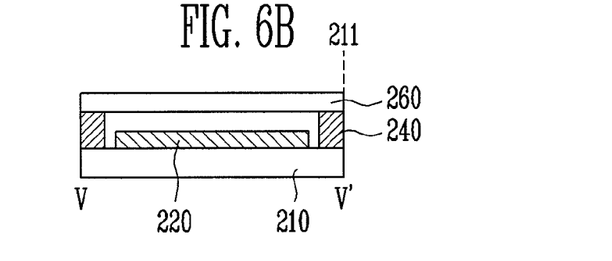
FIG. 6B is a cross-sectional view taken along section line V-V' of FIG. 5.

FIG. 5 is a top view showing an organic light emitting display device 200 according to the first exemplary embodiment. FIG. 6A is a cross-sectional view taken along section line IV-IV' of FIG. 5. FIG. 6B is a cross-sectional view taken along section line V-V' of FIG. 5.

Referring to FIGS. 5, 6A and 6B, the organic light emitting display device 200 includes a first substrate 210 having an organic light emitting diode 220 and a pad portion 230 formed thereon; a second substrate 260 protecting the organic light emitting diode 220; and a seal 240 coupling the second substrate 260 to the first substrate 210.

The organic light emitting diode 220 is disposed on a pixel region of the first substrate 210, and the pad portion 230 is disposed on a non-pixel region surrounding the pixel region of the first substrate 210. Also, the second substrate 260 is disposed on the first substrate 210 in order to protect the organic light emitting diode 220 formed on the pixel region. If the organic light emitting display device 200 has a top emission structure, a transparent substrate such as glass may be used as the second substrate 260. An opaque substrate may be used as the second substrate 260 if the display device 200 has a bottom emission structure.

Also, the seal 240 is applied onto the second substrate 260 in a region corresponding to the circumference of the organic light emitting diode 220 to couple the second substrate 260 to the first substrate 210.

The seal 240 is disposed in an outer ring defined by a first side 221 disposed between the organic light emitting diode 220 and the pad portion 230, a second side 222 facing the first side 221, and third sides 223 contacting both ends of the first side 221 and the second side 222. The seal disposed at the third sides 223 extends to the edges or contour lines 211 of the first substrate 210 and the second substrate 260, as shown in FIG. 6B. That is to say, the seals 240 at the outer ring on the first 221, second 222, and third 223 sides have different widths in the illustrated embodiment. Here, the first side 221 is disposed between the organic light emitting diode 220 and the pad portion 230, the second side 222 faces the first side 221, and the third sides 223 are adjacent to and contact both sides of the first side 221 and the second side 222. The contour line 211 is defined by the edges of the first substrate 210 and the second substrate 260.

The seal 240 comprises at least one polymeric compounds, epoxy, acrylic, radiation curing resin, thermosetting resin, and polyimide, and inorganic materials such as frit.

FIGS. 7A to 7D are top process views showing a method of fabricating an organic light emitting display device according to the first exemplary embodiment. FIG. 8 is a cross-sectional view taken along section line VI-VI' of FIG. 7B.

Figure 7A:
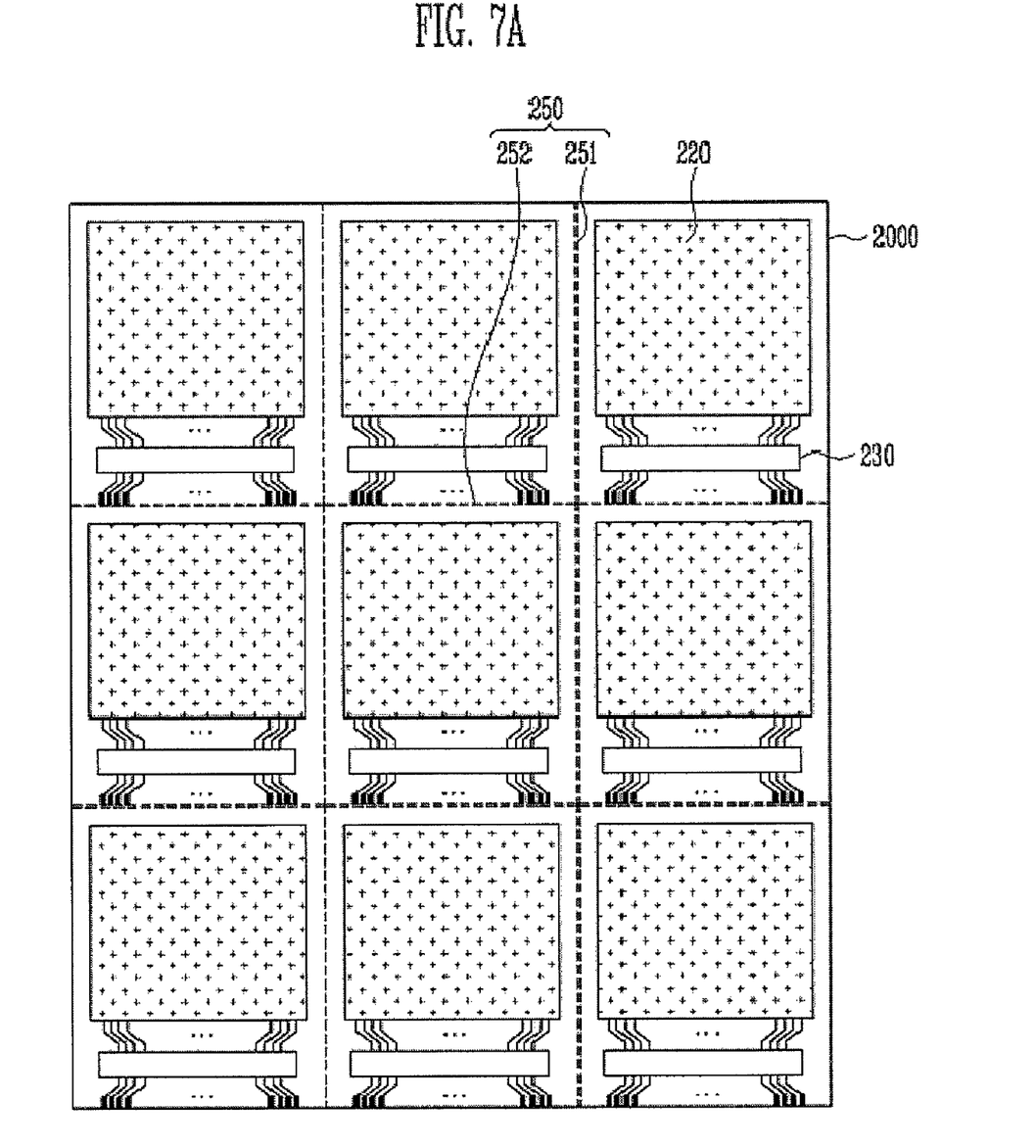
FIGS. 7A to 7D are top process views showing a method of fabricating an organic light emitting display device according to the first exemplary embodiment.
Figure 8:
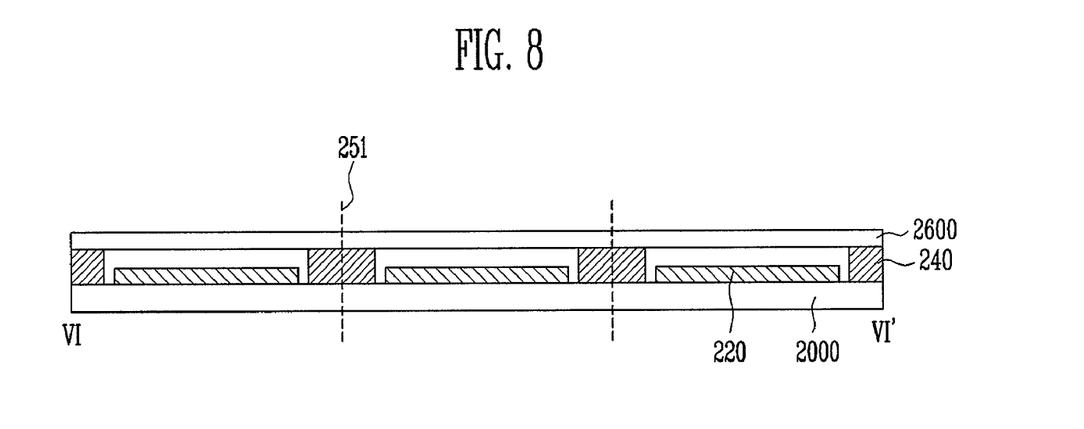
FIG. 8 is a cross-sectional view taken along section line VI-VI' of FIG. 7B.

Referring to FIG. 7A, a plurality of organic light emitting diodes 220 and pad portions 230 are formed on a first mother substrate 2000.

Figure 7B:
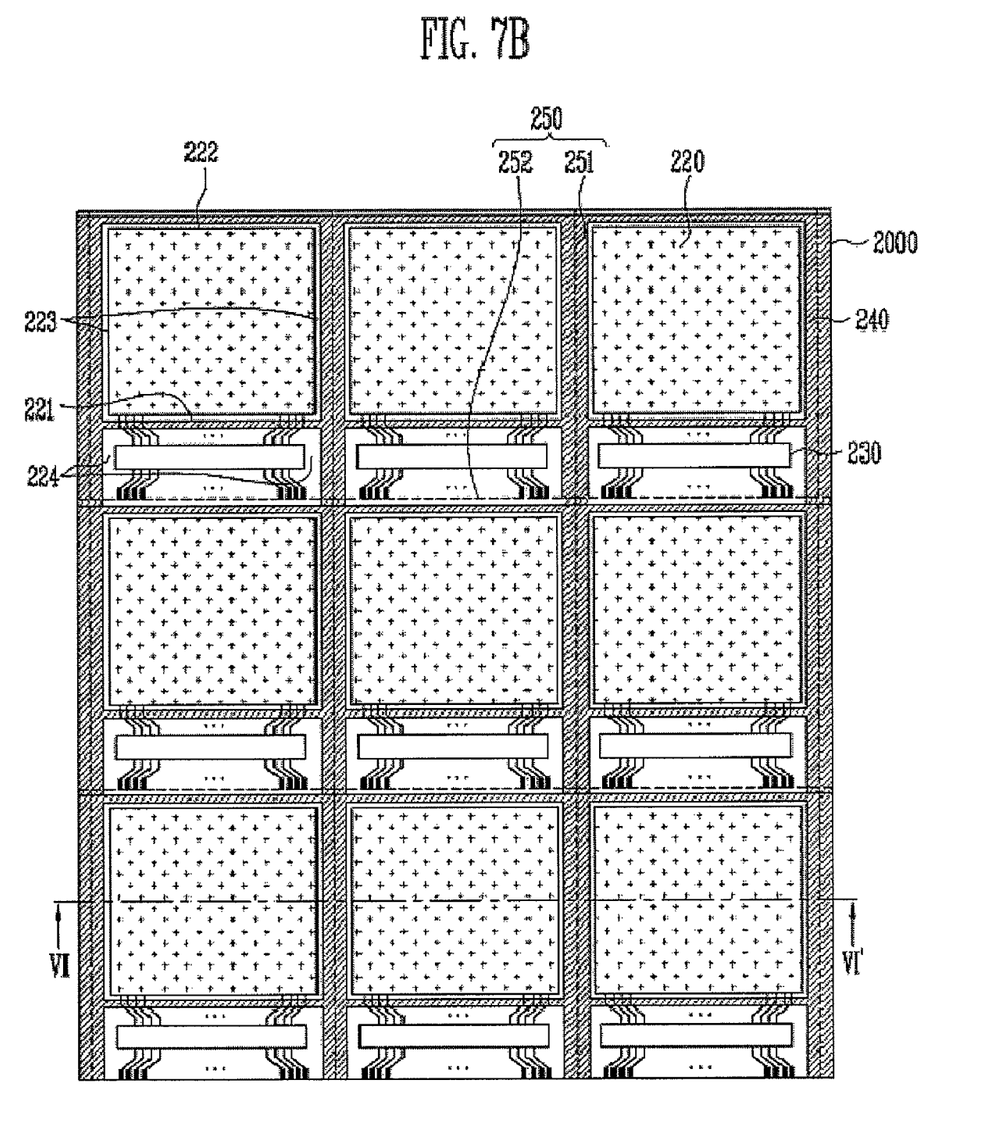

Referring to FIG. 7B, in order to couple a second mother substrate 2600 (FIG. 8) to the first mother substrate 2000, a seal 240 is applied to the second mother substrate 2600 corresponding to the outer rings of the first side 221 and the second side 222 that are disposed between the organic light emitting diode 220 and the pad portion 230. Also, the seal 240 is also applied onto the outer rings of the third sides 223 adjacent to and contacting both ends of the first side 221 and the second side 222. At this time, the seal 240 applied onto the outer ring of the third sides 223 on both sides of the first scribe line 251. Therefore, the seal 240 applied to the outer ring of the third sides 223 forms a common seal line between the adjacent organic light emitting diodes 220.

As described herein, the scribe lines 250 are lines formed on the coupled first mother substrate 2000 and second mother substrate 2600 to separate the first mother substrate 2000 and the second mother substrate 2600 into unit display panels, wherein the first scribe line 251 comprises a line formed between homogeneous regions, and the second scribe line 252 comprises a line formed between heterogeneous regions. That is to say, the first scribe line 251 comprises a line formed between adjacent organic light emitting diodes 220 of adjacent displays, and the second scribe line 252 comprises a line formed between the pad portion 230 and the organic light emitting diode 220 of adjacent displays.

Then, the seal 240 couples the second mother substrate 2600 to the first mother substrate 2000. In coupling the second mother substrate 2600 to the first mother substrate 2000, the seal 240 is cured using a laser and/or infrared radiation. At this time, the seal 240 applied onto the outer ring of the sides 224 of the pad portion 230 is not irradiated with a laser and/or infrared radiation. In order not to cure the seal 240 applied onto the outer ring of the sides 224 of the pad portion 230, a mask is applied thereover during irradiation with laser and/or infrared radiation, or a power of a laser irradiation apparatus is turned off.

Figure 7C:
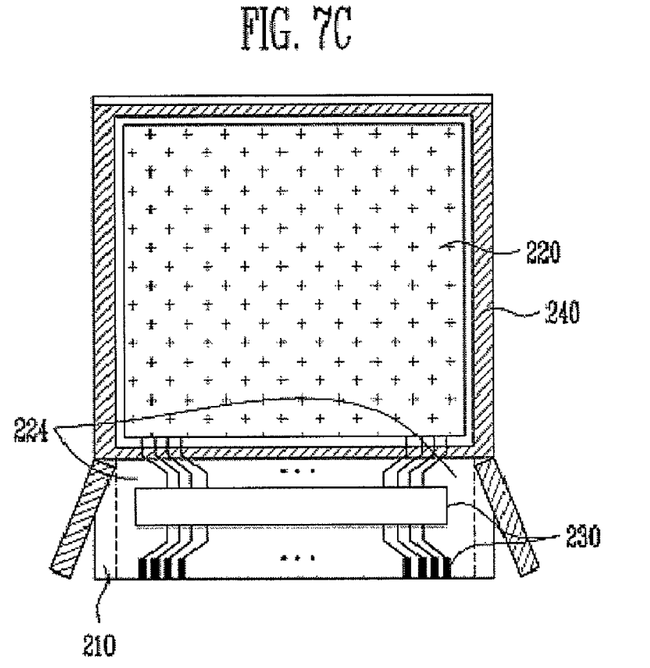

Referring to FIG. 7C, a scribing process is carried out along the scribe lines 250 formed in the first mother substrate 2000 and the second mother substrate 2600. The scribing is a part of a process for separating the coupled first mother substrate 2000 and second mother substrate 2600 into a plurality of display panels using a scriber or a laser for the scribe line 250.

The first mother substrate 2000 and the second mother substrate 2600, which are coupled through the sealing process, are separated into a plurality of separate display panels. At this time, an external pressure is applied to the first scribe line 251 over the seal 240, and the second scribe line 252 during the cutting process, and then their central region is cut.

Also, the cutting processes are different when the seal 240 comprises polymeric compounds such as epoxy, than when the seal 240 comprises inorganic materials such as frit.

For example, if the seal 240 comprises inorganic materials, cracks are formed in the scribe line 250 using a scriber, and then an external pressure is applied to the scribe line 250 to separate the coupled first mother substrate 2000 and the second mother substrate 2600 into a plurality of display panels, whereas the scribe line 250 is irradiated with a laser to cut the first mother substrate 2000 and the second mother substrate 2600 if the seal 240 comprises polymeric compounds.

Because the hardness of the inorganic materials is similar to the hardness of the first mother substrate 2000 and the second mother substrate 2600 in some embodiments in which the seal 240 comprises an inorganic material, cracks generated in the scribe lines 250 are easily spread through the seal 240 when external pressure is applied to the scribe lines 250. Cracks are not spread in the seal 240 in some embodiments in which the seal 240 comprises a polymeric compound due to the physical properties such as ductility and viscosity even when an external pressure is applied to the first mother substrate 2000 and the second mother substrate 2600. Therefore, if the seal 240 comprises polymeric compounds, the scribing process uses a laser to fully cut the first mother substrate 2000 and the second mother substrate 2100.

Also, a forming time and a curing time of the seal 240 may be reduced by forming a common seal 240 between the adjacently disposed organic light emitting diodes 220.

That is to say, for this exemplary embodiment, a line shape of the seal 240 is applied to a first scribe line 251, a first side 221 between the organic light emitting diode 220 and the pad portion 230, and a second side 222 facing the first side 221, which leads to a decreased forming time of the seal 240. In order to cure the seal 140 as shown in FIG. 2, a laser irradiation apparatus also moves along the rectangular shape of the seal 140, but the curing time of the seal 240 may be reduced by allowing the laser irradiation apparatus to move straight from one side to the other side along the line shape of the seal 240 in the first exemplary embodiment.

In order to expose the pad portion 230, the second substrate 260 formed on the pad portion 230 is then cut. At this time, portions of the seal 240 disposed in the outer ring of the side surface 224 of the pad portion 230, and the first 210 and second substrates 260 do not adhere since the seal 240 disposed on the outer ring of the side surface 224 of the pad portion 230 is not cured. Therefore, the seal 240 disposed on the outer ring of the side surface 224 of the pad portion 230 may be detached from the first substrate 210 together with the second substrate 260 when the second substrate 260 corresponding to the pad portion 230 is cut.

Figure 7D:
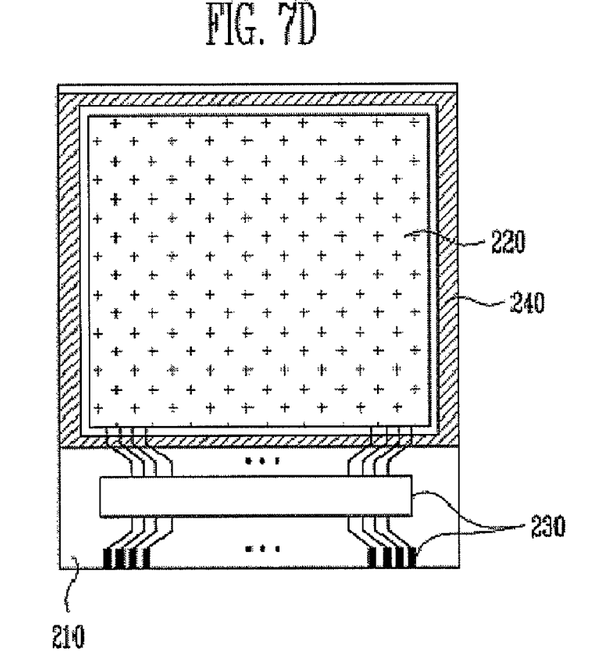

Referring to FIG. 7D, a flexible printed circuit board supplying a signal to the organic light emitting diode 220, etc. may be connected to the exposed pad portion 230. Also, the signal supplied through the flexible printed circuit board (FPCB) is applied to a scan driver and a data driver of the pixel region, which drive the organic light emitting diode 220.

Figure 9:
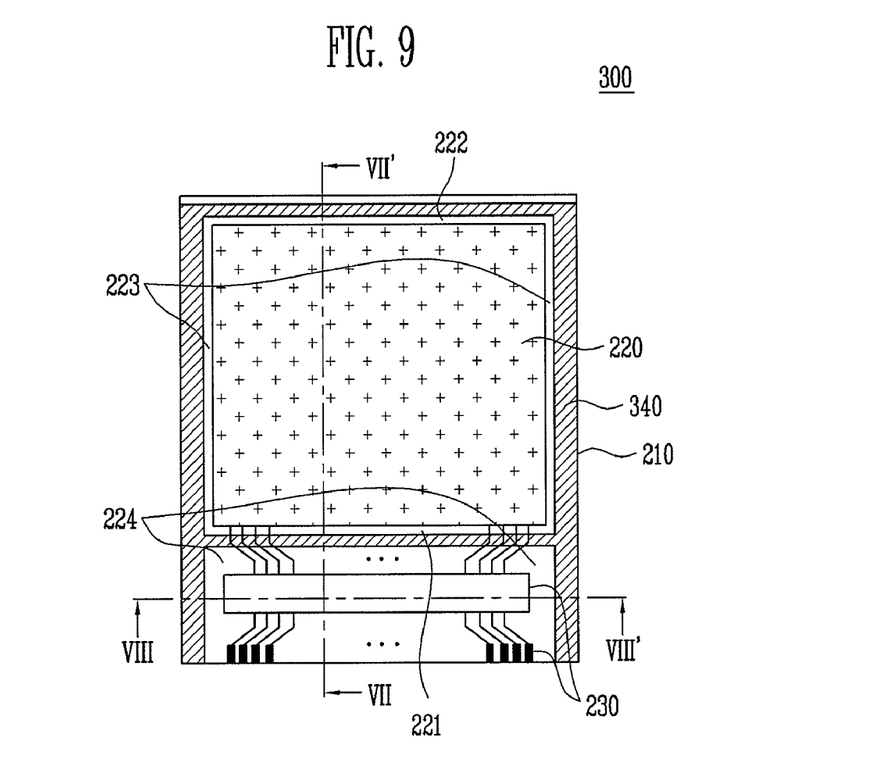
FIG. 9 is a top view showing an organic light emitting display device according to a second exemplary embodiment.
Figure 10A:
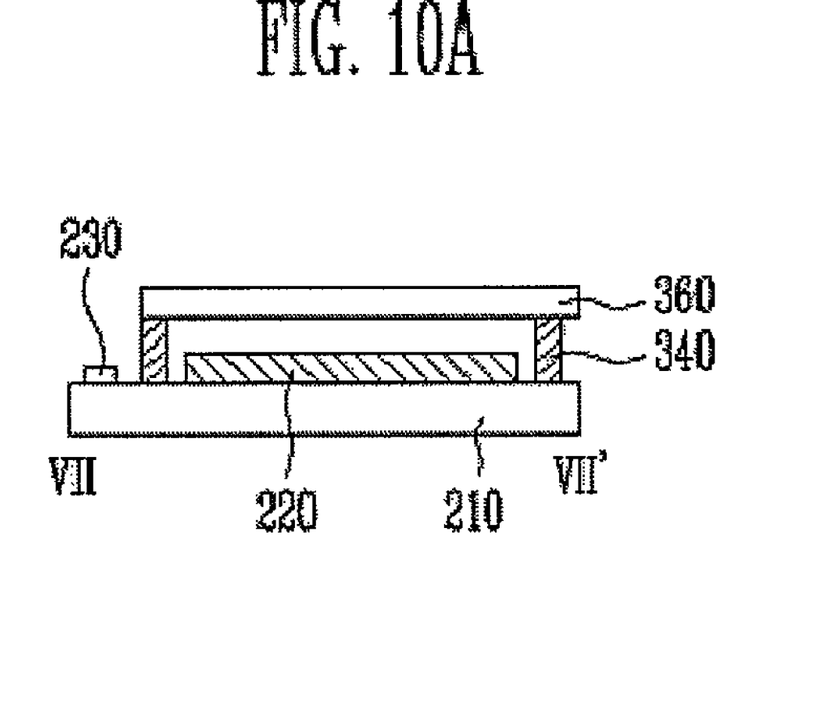
FIG. 10A is a cross-sectional view taken along section line VII-VII' of FIG. 9.
Figure 10B:
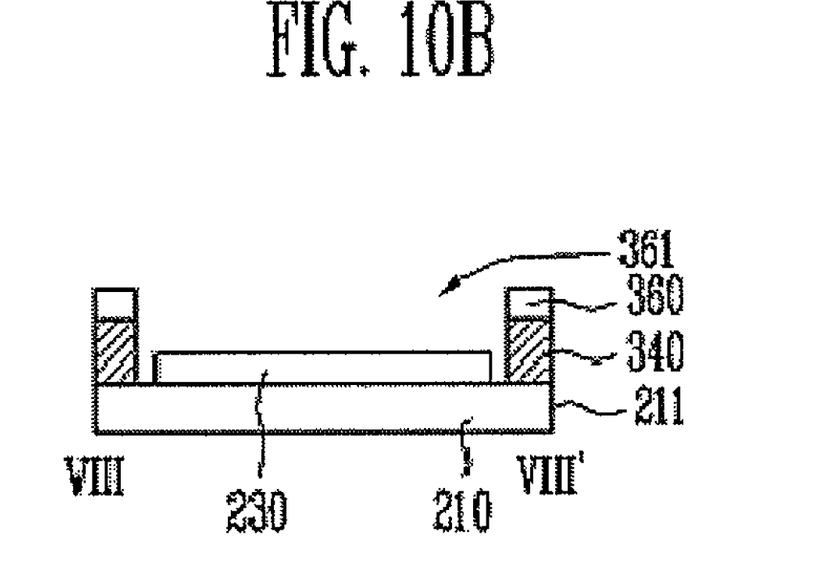
FIG. 10B is a cross-sectional view taken along section line VIII-VIII' of FIG. 9.

FIG. 9 is a top view showing an organic light emitting display device 300 according to the second exemplary embodiment. FIG. 10A is a cross-sectional view taken along section line VII-VII' of FIG. 9. FIG. 10B is a cross-sectional view taken along section line VIII-VIII' of FIG. 9.

Referring to FIGS. 9, 10A and 10B, the second exemplary embodiment is generally similar to the first exemplary embodiment, but the organic light emitting display device 300 according to the second exemplary embodiment further includes a seal 340 disposed in an outer ring of the side surface 224 of the pad portion 230.

Unlike the embodiment illustrated in FIG. 7B, the entire seal 340 is cured by irradiating with a laser and/or infrared radiation. Therefore, the seal 340 disposed in the outer ring of the side surface 224 of the pad portion 230 couples the second substrate 360 to the first substrate 210.

A portion of the second substrate 360 corresponding to the pad portion 230 is cut away, thereby facilitating the coupling of a flexible printed circuit board (FPCB) to the pad portion 230. Therefore, the second substrate 360 has an opening 361 corresponding to the pad portion 230.

Also, apparatus reliability of the side surface 224 of the pad portion 230 may be improved since the seal 340 is further disposed on the side surface 224 of the pad portion 230 in this exemplary embodiment.

Figure 11:
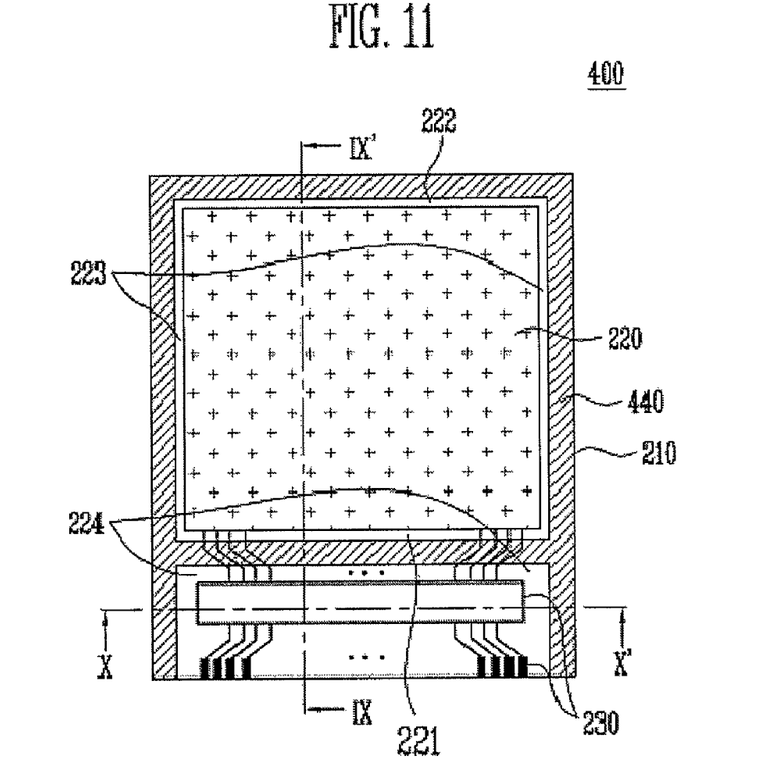
FIG. 11 is a top view showing an organic light emitting display device according to a third exemplary embodiment.
Figure 12A:
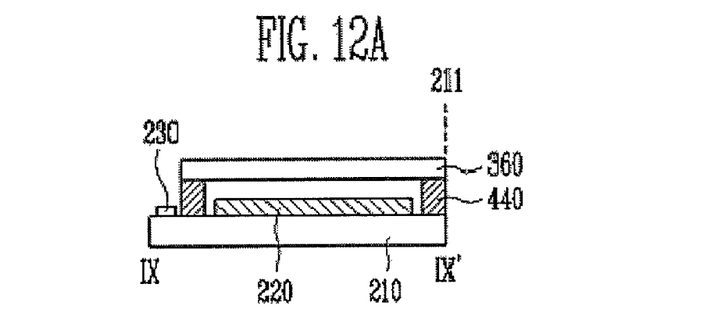
FIG. 12A is a cross-sectional view taken along section line XI-XI' of FIG. 11.
Figure 12B:
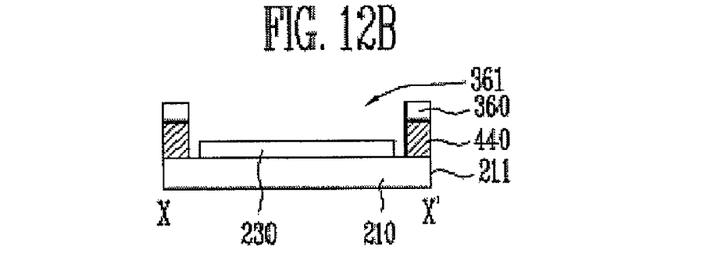
FIG. 12B is a cross-sectional view taken along 1 section line X-X' of FIG. 11.

FIG. 11 is a top view showing an organic light emitting display device 400 according to the third exemplary embodiment. FIG. 12A is a cross-sectional view taken along section line XI-XI' of FIG. 11. FIG. 12B is a cross-sectional view taken along section line X-X' of FIG. 11.

Referring to FIGS. 11, 12A and 12B, the organic light emitting display device 400 is generally similar to the second exemplary embodiment, but the seal 440 has a substantially constant width. That is to say, the seals 440, disposed in the outer rings of the first side 221, the second side 222, the third side 223 and the side surface 224 of the pad portion 230, all have substantially the same width. Also, the seals 440, disposed on the outer rings of the second side 222, the third side 223 and the side surface 224 of the pad portion 230, are filled up to the edges or contour lines 211 of the first substrate 210 and the second substrate 360. As described above, a space between the first substrate 210 and the second substrate 360 is filled with the seals 440 disposed in the outer rings of the second side 222, the third side 223 and the side surface 224 of the pad portion 230, which leads to the improved apparatus reliability of the organic light emitting display device 400.

As described above, according to the exemplary embodiments, a forming time and a curing time of the seal may be reduced by forming common seal lines between the adjacently disposed light emitting diodes when a plurality of the light emitting diodes are manufactured on a mother substrate.

Some exemplary embodiments of the organic light emitting display device (OLED) are described in detail herein, but it is evident to those skilled in the art that a liquid crystal display (LCD), a field emission display (FED), a plasma display panel (PDP), an electroluminescent display (ELD), and a vacuum fluorescent display (VFD) may be used herein.

Although exemplary embodiments have been shown and described, it would be appreciated by those skilled in the art that changes might be made in these embodiments without departing from the principles and spirit thereof, the scope of which is defined in the claims and their equivalents.

What is claimed is:

1. A method of fabricating a light emitting display device comprising:
   providing a first mother substrate comprising a plurality of unit display panels disposed thereon, first single scribe lines disposed between homogeneous regions of adjacent display panels, and second single scribe lines disposed between heterogeneous regions of adjacent display panels, wherein each unit display panel comprises a pixel region comprising a plurality of light emitting diodes formed therein and a non-pixel region surrounding the pixel region comprising a pad portion formed therein;

applying a seal continuously around a circumference of the pixel region so as to enclose the pixel region and over the first single scribe lines so that the seal is continuous and uniform along its length;

disposing a second mother substrate on the first mother substrate, wherein the second mother substrate comprises first scribe lines and second scribe lines corresponding to the first scribe lines and second scribe lines of the first mother substrate;

curing the seal to couple the second mother substrate to the first mother substrate wherein the seal comprises a first side disposed between the pixel region and the pad portion, a second side opposite the first side and third sides contacting both ends of the first side and the second side wherein the width of the third sides are wider than the widths of the first and second sides of the seals; and cutting the coupled first mother substrate and second mother substrate along the first and second scribe lines to separate the first mother substrate and the second mother substrate into individual unit display panels wherein the first and second scribe lines are positioned so as to be interposed between the outer edges of seals on adjacent individual unit display panels so that the seal of the individual display units extend continuously along its length to the ends of the first and second substrate on at least two sides of the individual display unit.

2. The method of fabricating a light emitting display device according to claim 1, wherein the curing the seal comprises disposing a mask on the pad portion.

3. The method of fabricating a light emitting display device according to claim 1, further comprising cutting and removing a portion of the second substrate disposed on the pad portion, thereby exposing the pad portion of the unit display panel after separating the coupled first mother substrate and second mother substrate into individual unit display panels.

4. The method of fabricating a light emitting display device according to claim 3, further comprising removing the seal from the non-pixel region of the pad portion.

* * * * *